United States Patent
Nguyen et al.

[11] Patent Number: 6,137,181
[45] Date of Patent: Oct. 24, 2000

[54] METHOD FOR LOCATING ACTIVE SUPPORT CIRCUITRY ON AN INTEGRATED CIRCUIT FABRICATION DIE

[76] Inventors: Dzung Nguyen, 4942 Barkwood Ave.; Youssef Yassine, 5051 Chateau Cir., both of Irvine, Calif. 92604

[21] Appl. No.: 09/405,856

[22] Filed: Sep. 24, 1999

[51] Int. Cl.[7] .......................... H01L 23/48; H01L 23/52; H01L 29/40
[52] U.S. Cl. ............................................ 257/773; 257/693
[58] Field of Search .................................. 257/737, 738, 257/739, 773, 784, 786, 207, 693; 174/260, 261; 361/748

[56] References Cited

U.S. PATENT DOCUMENTS

| | | |
|---|---|---|
| 3,808,475 | 4/1974 | Buelow et al. .......................... 257/204 |
| 4,255,672 | 3/1981 | Ohno et al. ................................ 326/47 |
| 5,216,278 | 6/1993 | Lin et al. .................................. 257/688 |
| 5,329,157 | 7/1994 | Rosotker .................................. 257/666 |

*Primary Examiner*—Jeffrey Gaffin
*Assistant Examiner*—Jeremy Norris
*Attorney, Agent, or Firm*—Snell & Wilmer, L.L.P.

[57] ABSTRACT

A method for reducing the die size of an integrated circuit by locating, on one of the four sides of the perimeter of an IC die, only the bonding pads ('standard I/O pads') which provide I/O functionality and which must occupy a predetermined location in accordance with an industry-standard. The active support circuit associated with each of these standard I/O pads is located on one or more of the three other sides at external connection locations which are otherwise unused, or 'spare'. The standard I/O pads on the first side of the IC die are connected, via wires, to the corresponding support circuitry on the other sides of the die.

11 Claims, 3 Drawing Sheets

METHOD FOR LOCATING ACTIVE SUPPORT CIRCUITRY ON AN INTEGRATED CIRCUIT FABRICATION DIE

BACKGROUND OF THE INVENTION

1. Technical Field

The present invention relates, generally, to placement of bonding pads and supporting circuitry on integrated circuit (IC) devices and, more particularly, to techniques for locating bonding pads and the associated supporting circuitry on different sides of an IC fabrication die.

2. Statement of the Problem

It is desirable in the fabrication of semiconductor devices to produce as many devices from a single wafer as possible. Increasing the number of die (from which the devices are fabricated) per wafer can be accomplished by increasing the size of the wafer and/or decreasing the size of the die. In either case, the probe yield (the percentage of good devices present on the wafer) is improved. However, known methods for minimizing the device die size employ the relatively time-consuming and costly task of customizing the IC layout and/or core circuitry.

A typical semiconductor device such as an integrated circuit (IC) has four sides, from each of which extend a number (typically 32) of 'external connecting pads'. Each external connecting pad is typically comprised of a bonding pad and an associated support circuit pad containing active support circuitry. Bonding pads are employed to establish contact points to which electrical connections are established (via a wire bond or the like) between the IC and an external circuit. The support circuitry associated with the various active bonding pads typically functions to protect the IC circuitry from deleterious electrical phenomenon such as electrostatic discharge (ESD) and latchup. Additional details regarding wire bonding and related techniques may be found in a number of standard references, for example, SERAPHIM ET AL., PRINCIPLES OF ELECTRONIC PACKAGING (1989).

Existing methods which attempt to reduce the device die size by customizing the IC layout or core circuitry may provide only limited decrease in die size because of design rules which require minimum sizes for bonding and support circuit pads in order to provide ESD/latchup immunity and sufficient bonding area.

A method is therefore needed to overcome these and other limitations of the prior art.

SUMMARY OF THE INVENTION

Solution to the Problem

The present invention provides a method which overcomes the shortcomings of the prior art. In accordance with one aspect of the present invention, the die size of an integrated circuit is reduced by locating, on one of the four sides of the perimeter of an IC die, only the bonding pads which provide I/O functionality and which must occupy a predetermined location in accordance with an industry-standard (i.e., 'standard I/O pads'). The active support circuit associated with each of these standard I/O pads is located on one or more of the three other sides at external connection locations which are otherwise unused, or 'spare'. The standard I/O pads on the first side of the IC die are connected, via wires, to the corresponding support circuitry on the other sides of the die. Since there are no active support circuits on the first side of the IC die, the present method reduces the size (surface area) of the die for a given integrated circuit.

BRIEF DESCRIPTION OF THE DRAWING

The subject invention will hereinafter be described in conjunction with the appended drawing figures, wherein like numerals denote like elements, and.

DETAILED DESCRIPTION

Figure 1:
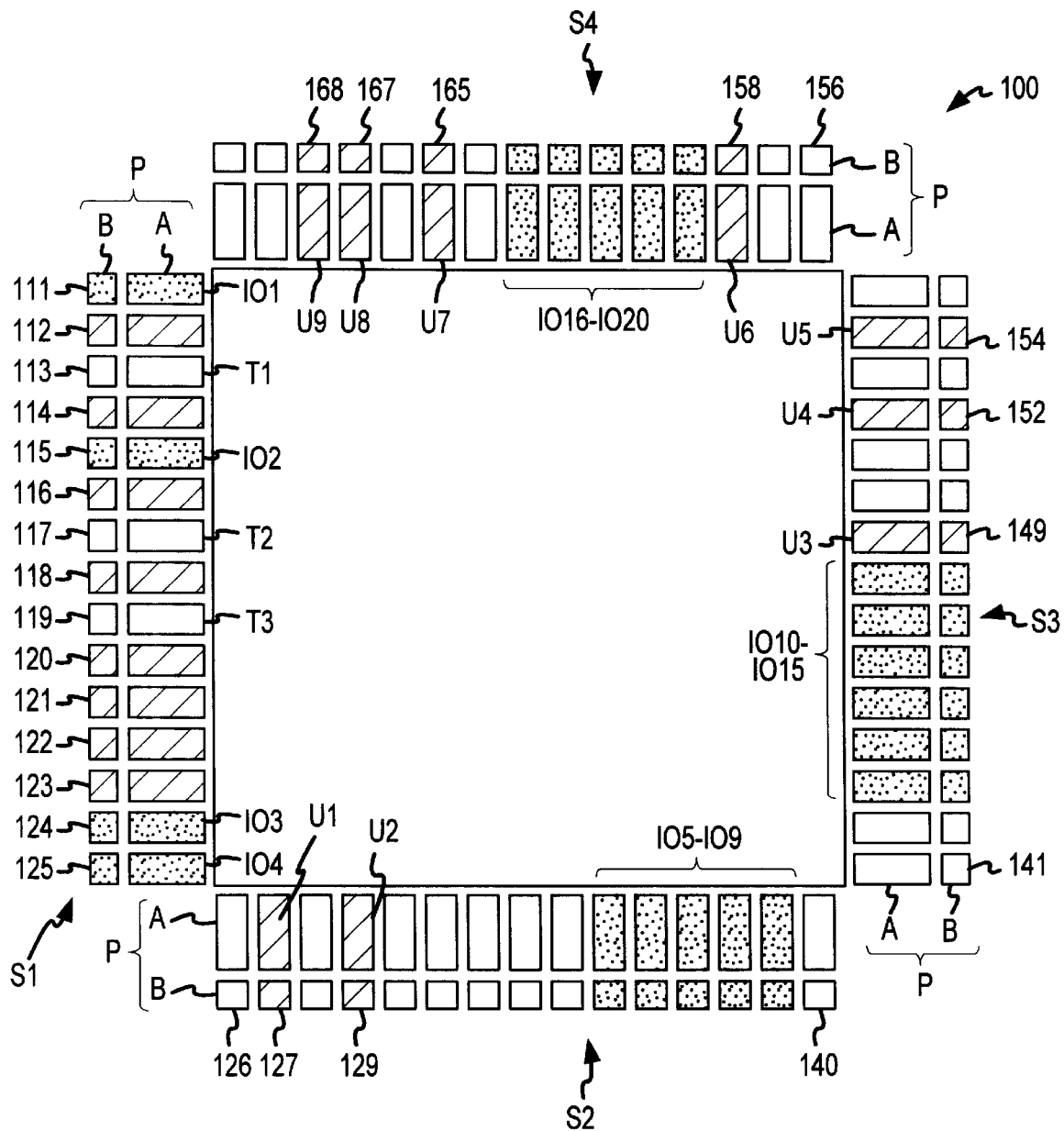
FIG. 1 is a diagram showing a prior art integrated circuit die having active support circuits on all sides of the perimeter of the die.

FIG. 1 is a diagram showing a prior art integrated circuit die 100 from which an integrated circuit (IC) is fabricated. Integrated circuit die 100 typically has between 32 and 64 external connecting pads Pnn (where nn is a two-digit number) located on each of the four sides of the perimeter of the die (although only 15 such pads are shown on each side of IC 100 in FIG. 1, for the purpose of clarity). Each external connecting pad Pnn is normally comprised of a bonding pad 1 nnB (where nn is a two-digit number) and a support circuit pad 1 nnA. External connecting pads Pnn are used to establish an electrical connection between the IC and an external circuit (not shown). Each support circuit pad 1 nnA contains an active support circuit which provides electrostatic discharge and latchup immunity for the associated IC 100.

Bonding pads 1 nnB provide a surface to which a wire bond or other media may be connected in order to provide electrical connection to and from the integrated circuit ultimately fabricated from die 100. In addition, bonding pads provide a contact which can be used to electrically probe (i.e., test) the die during or after wafer processing. Bonding pads may be fabricated by a variety of conventional thin-film processes, e.g., sputtering, evaporation, chemical vapor deposition, and the like. The size of a particular bonding pad 1 nnB is typically selected in accordance with applicable wire bond design rules. In a typical die 100, bonding pads 1 nnB are rectangular and measure approximately 80 $\mu$m×100 $\mu$m. Any convenient bonding wire material may be used to provide this connection between the standard I/O pads and the corresponding support circuitry, including, for example, aluminum, aluminum alloys (Al—Mg—Si, Al—Si, Al—Mg, Al—Cu), gold, or gold-beryllium.

In the present example, the prior art IC die 100 of FIG. 1 has 15 external connecting pads P111 through P125 located on the perimeter of the left side (side S1) of die 100. External connecting pads P111, P115, P124, and P125 on side S1 are standard I/O pads (also labeled as IO1–IO4). External connecting pads IO5–IO9, IO10–IO15, and IO16–IO20, on sides S2, S2, and S3, respectively, are also standard I/O pads. The standard I/O pads depicted in FIG. 1 are shown as having a solid (shaded) color, for the purpose of clarity. Standard I/O pads must occupy their respective predetermined locations on the fabricated IC in order to provide proper pinout compatibility with the type of IC to be fabricated from die 100.

External connecting pads P113, P117, and P119 (also labeled as T1–T3, respectively) on side S1 are 'test pads' which are used only for internal testing of the IC, and which can be located on any side of IC die 100. The external connecting pads on sides S2–S4 which are not shaded, are also test pads (although not labeled specifically as such, for the purpose of clarity). The remaining external connecting pads (P112, P114, P116, P118, P120–P123) located on the perimeter of side S1 of die 100 are, in the present example, unused, i.e., 'spare' pads. In addition, external connecting pads P126, P129, P129, P149, P154, P158, P167, and P168, which are located on the remaining three sides of the perimeter of IC 100, are also spare pads.

Figure 2:
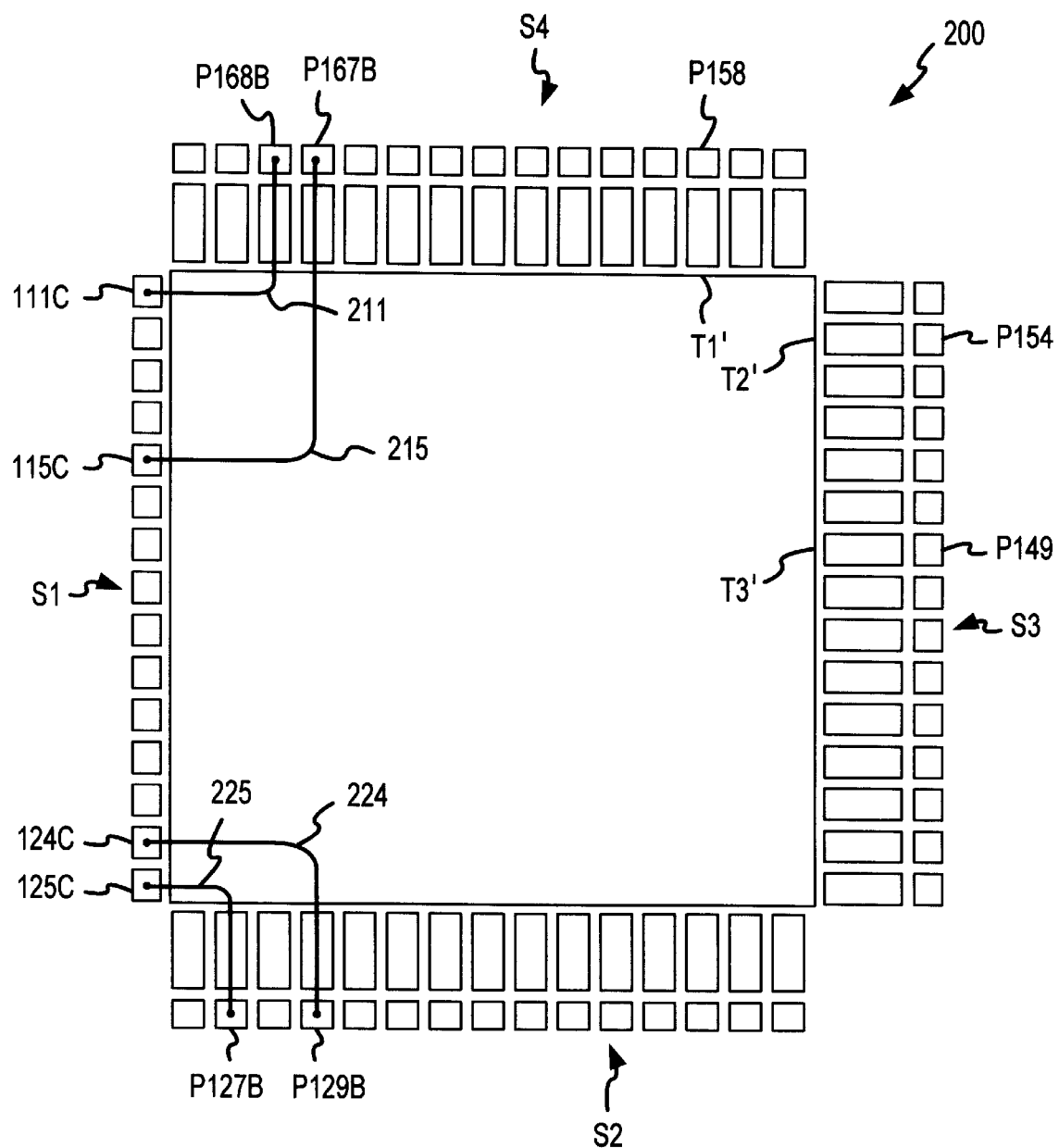
FIG. 2 is a diagram showing an integrated circuit die wherein one side of the perimeter of the die is devoid of active support circuits and the standard I/O pads on one side of the perimeter of the die are connected to active support circuits on other sides of the die.

FIG. 2 is a diagram showing an integrated circuit die 200 in accordance with an exemplary embodiment of the present invention wherein one side (side S1) of the perimeter of the die 200 is devoid of active support circuits, and wherein the standard I/O pads (IO1–IO4) on side S1 of the perimeter of the die are connected to active support circuits (1 nnA) on adjacent sides (S2 and S4) of the die. In accordance with an exemplary embodiment of the present invention, the standard I/O pads on a selected side of IC die 200 are connected, via wires, to corresponding support circuits located at spare external connecting pads on the other sides of die 200; and the test pads which were on this selected side (in the die design of FIG. 1) are also relocated (relative to die 100) to spare external pad positions on the other sides of die 200. In this manner, no active support circuits are required on the selected side of die 200, thereby reducing the size (i.e., the surface area) of die 200 accordingly.

Figure 3:
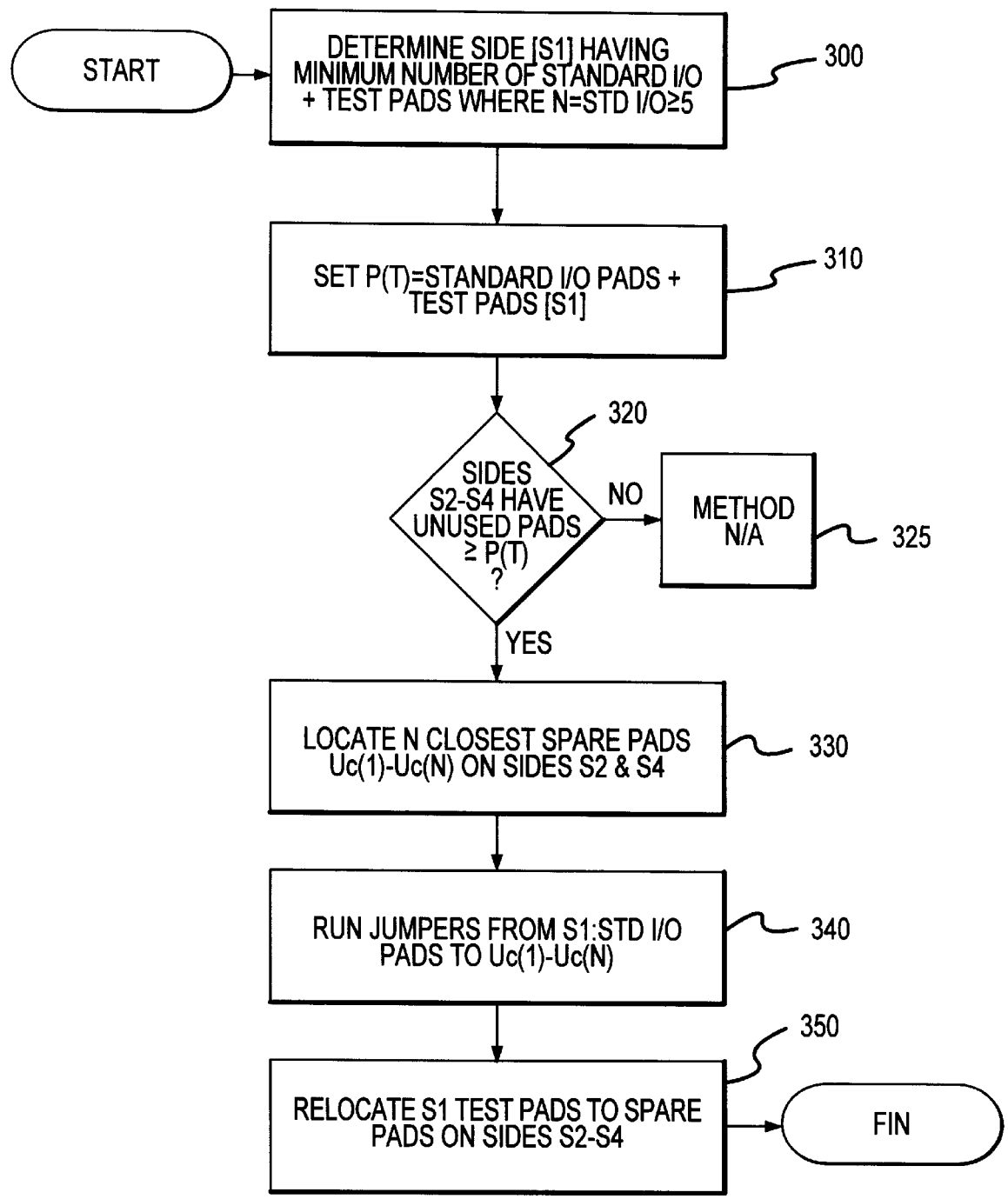
FIG. 3 is a flowchart showing the steps performed in reducing the area of an existing integrated circuit die.

FIG. 3 is a flowchart showing the steps which may be performed in order to reduce the area of an existing integrated circuit die 100 (or the design for IC die 100). The operation of the present method is best understood from a reading of FIGS. 1, 2, and 3 taken in conjunction with one another.

The present method operates to reduce the area of IC die 200 relative to die 100 (FIG. 1), which is pin-compatible and functionally equivalent to die 200, by the process which is explained as follows. At step 300 (FIG. 3), sides S1 through S4 of die 100 (or the design therefor) are inspected (FIG. 1) to determine which side S(min) has the least total number of standard I/O pads (N) plus test pads (M), where $N \leq 5$. It is preferable that $N \leq 5$, but the present method is operable if the minimum number of standard I/O pads on any side of the die is greater than 5, although the advantages of the method may be compromised. In the present example, S(min) is side S1 of die 100, because side S1 has the least total number (7) of standard I/O pads (4) plus test pads (3). Furthermore, since side S1 of die 100 has 4 standard I/O pads, Side S1 meets the criterion that N (standard I/O pads)$\leq 5$. Note that sides S2, S3, and S4 of die 100 have 5, 6, and 5 standard I/O pads and 8, 6, and 6 test pads, respectively, and therefor, each of these sides has more than side S1's minimum total of 7.

Next, at step 310, the value P(T) is set to the sum of the number of standard I/O pads N and the number of test pads M on the side selected in step 300 (side S1, in this case). As determined in step 300, side S1 (of each die 100 and 200) has 4 standard I/O pads and 3 test pads; therefore P(T)=7 in the present example. P(T) represents the total number of external connecting pads Pnn on the selected side S1 which require counterpart spare external connecting pads on the non-selected sides (S2–S4, in this case).

Therefore, a check is made at step 320 to determine whether the remaining sides S2–S4 (i.e., the sides not selected in step 300) have at least a total number P(T) of spare external connecting pads U(T). Sides S2, S3, and S4 have 2, 3, and 4 spare external connecting pads, respectively (which are labeled as U1–U9 on FIG. 1), yielding a value of U(T)=9, since there are 9 total spare external connecting pads U(n) on these remaining sides. Thus, $U(T) \geq P(T)$, since U(T)=9 and P(T)=7. Therefore, sides S2–S4 have (at least) three spare external connecting pads to accomodate the three test pads (T1, T2, T3) which are to be relocated from side S1, plus (at least) four additional spare external connecting pads containing active support circuits to which the four standard I/O pads (IO1–IO4) are to be connected. If, however, U(T)<P(T) [a situation which is not shown], then there would be an insufficient number of spare external connecting pads to accomodate the requirements of the present method, which would not be applicable in that situation (step 325).

Next, at step 330, the N closest spare external connecting pads Uc(1)–Uc(N) on sides S2 and S4 are located (where N is the number of standard I/O pads on side S1). Note that sides S2 and S4 are adjacent to side S1, and therefore these sides are closer to side S1 than is side S3. Should sides S2 and S4 have fewer than N total spare pads, spare pads on side S3 may be located for use in the following step. In the present example, since N=4, spare external connecting pads Uc(1)–Uc(4) correspond to pads U1, U2, U8, and U9 (comprising pads P127, P129, P167, and P168), respectively (on both dies 100 and 200).

At step 340, jumpers 211, 215, 224, and 225 are connected between bonding pads 211C, 215C, 224C, and 225C (corresponding to standard I/O pads IO1–IO4) on side S1 and spare bonding pads P168B, P167B, P129B, and P127B on sides S2 and S4 on die 200 (FIG. 2). These jumpers are preferably 80 micron diameter copper wires, although wires of any suitable material or diameter may be used to connect the bonding pads for pads IO1–IO4 on side S1 to corresponding spare bonding pads on sides S2 and S4.

Finally, at step 350, test pads T1, T2, and T3 on side S1 on die 100 ( or the design therefor) are relocated to spare external connecting pads T1', T2', and T3', corresponding to pads P158, P154, and P149, respectively, on sides S3 and S4 of die 200. It should be noted that the test pads T1–TN may be located at spare pad positions on any of the sides S2–S4 on die 200. In comparison to die 100, die 200 occupies approximately 6% less area by virtue having one side of its perimeter devoid of any active support circuit pads.

In another aspect of the present invention, die 200 may be designed and/or fabricated without reference to a pre-existing die 100. The present method may also be employed to minimize the area of any integrated circuit die by locating all active support circuit pads on three sides of the die, and connecting the standard I/O pads on the remaining side of the die to support circuitry on the other sides of the die. It should be noted that the present method is operable with an IC die having any number of external connecting pads Pnn per side of the IC die, as long as there are a sufficient number of spare external connecting pads Pnn on three of the sides to accommodate the total number of pads Pnn resulting from the sum of the (standard I/O pads+test pads) on the fourth side of the die. In the present example, the number of pins-per-side, unused (spare) external connecting pads, test pads, and standard I/O pads shown in FIG. 1 are hypothetical, for the purpose of illustration.

Although the invention has been described herein in conjunction with the appended drawings, those skilled in the art will appreciate that the scope of the invention is not so limited. Modifications in the selection, design, and arrangement of the various components and steps discussed herein may be made without departing from the scope of the invention as set forth in the appended claims.

What is claimed is:

1. An integrated circuit die having a plurality of external connecting pads located on each of four sides, including a first side and three other sides, of the perimeter of the die, wherein some of the external connecting pads are standard I/O pads, and wherein each of the external connecting pads on the die include a bonding pad, said die comprising:

active support circuits located on only said three other sides of the die; and a plurality of wires, each of which is connected between said bonding pad for one of the standard I/O pads on the first side of the die and a corresponding one of the active support circuits on the three other sides of the die.

2. The integrated circuit die of claim 1, wherein said external connecting pads include test pads used for internal testing, said die further comprising a plurality of said test pads located only on said other three sides.

3. The integrated circuit die of claim 1 wherein said bonding pads of said standard I/O pads of said first side are connected by said plurality of wires to the closest of said active support circuits.

4. The integrated circuit die of claim 2 wherein said bonding pads of said standard I/O pads of said first side are connected by said plurality of wires to the closest of said active support circuits.

5. The integrated circuit die of claim 4 wherein said bonding pads of said test pads are connected by said plurality of wires to the closest of said active support circuits which are not connected to said bonding pads of said standard I/O pads.

6. The integrated circuit die of claim 2 wherein said first side has fewer of said standard I/O pads plus said test pads than each of said three other sides.

7. The integrated circuit die of claim 2 wherein the number of said standard I/O pads of said first side is less than or equal to 5.

8. The integrated circuit die of claim 2 wherein said external connecting pads of said three other sides further comprise spare external connecting pads and wherein the number of said spare external connecting pads is at least equal to the number of standard I/O pads plus said test pads of said first side.

9. The integrated circuit die of claim 8 wherein said active support circuits are located at said spare external connecting pads.

10. The integrated circuit die of claim 9 wherein said bonding pads of said standard I/O pads of said first side are connected by said plurality of wires to the closest of said active support circuits.

11. The integrated circuit die of claim 10 wherein said bonding pads of said test pads are connected by said plurality of wires to the closest of said active support circuits which are not connected to said bonding pads of said standard I/O pads.

* * * * *